United States Patent
Leung et al.

(10) Patent No.: US 11,160,190 B1
(45) Date of Patent: *Oct. 26, 2021

(54) APPARATUS, SYSTEM, AND METHOD FOR PREVENTING DEMATE BETWEEN FIELD-REPLACEABLE UNITS AND TELECOMMUNICATIONS SYSTEMS

(71) Applicant: Juniper Networks, Inc., Sunnyvale, CA (US)

(72) Inventors: Jimmy Chun-Chuen Leung, Fremont, CA (US); Franklin D. Boyden, Pleasanton, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,634

(22) Filed: Mar. 5, 2020

Related U.S. Application Data

(63) Continuation of application No. 16/118,639, filed on Aug. 31, 2018, now Pat. No. 10,645,839.

(51) Int. Cl.
*H05K 7/18* (2006.01)
*H04Q 1/02* (2006.01)
*H04Q 1/12* (2006.01)
*G06F 1/18* (2006.01)

(52) U.S. Cl.
CPC ............ *H05K 7/186* (2013.01); *G06F 1/186* (2013.01); *H04Q 1/12* (2013.01); *H04Q 1/15* (2013.01)

(58) Field of Classification Search
CPC ...... H05K 7/186; H05K 7/1411; G06F 1/186; H04Q 1/12; H04Q 1/15
See application file for complete search history.

(56) References Cited

U.S. PATENT DOCUMENTS

| | | | |
|---|---|---|---|
| 5,414,594 A | 5/1995 | Hristake | |
| 6,695,520 B1 * | 2/2004 | Sarno | H05K 7/1409 292/64 |
| 6,916,190 B2 | 7/2005 | Joist | |
| 7,125,272 B1 | 10/2006 | Liang | |
| 8,295,055 B2 | 10/2012 | Van Der Mee et al. | |

(Continued)

OTHER PUBLICATIONS

Non-Final Office Action received for U.S. Appl. No. 16/118,639 dated Oct. 7, 2019, 28 pages.

(Continued)

*Primary Examiner* — James Wu
*Assistant Examiner* — Hung Q Dang
(74) *Attorney, Agent, or Firm* — FisherBroyles, LLP

(57) ABSTRACT

The disclosed apparatus may include (1) an FRU that (A) is designed to mate with a backplane of a telecommunications system and (B) facilitates communication among computing devices within a network and (2) at least one multi-bar ejector that (A) is coupled to the FRU, (B) fastens to a housing of the telecommunications system to enable the FRU to mate with the backplane of the telecommunications system, and (C) includes a spring coupled to at least one bar of the multi-bar ejector that, when the multi-bar ejector is fastened to the housing of the telecommunications system, applies a force on the FRU that pushes the FRU toward the backplane of the telecommunications system. Various other apparatuses, systems, and methods are also disclosed.

18 Claims, 7 Drawing Sheets

(56) References Cited

U.S. PATENT DOCUMENTS

| | | | |
|---|---|---|---|
| 8,369,080 B2* | 2/2013 | Huang | G06F 1/187 |
| | | | 361/679.38 |
| 8,611,103 B2 | 12/2013 | Thomas et al. | |
| 9,730,356 B2 | 8/2017 | Franz et al. | |
| 9,766,667 B1* | 9/2017 | Singer | H05K 7/1409 |
| 9,788,454 B1 | 10/2017 | Leung et al. | |
| 10,136,540 B2 | 11/2018 | Magnoux | |
| 10,285,291 B1 | 5/2019 | Lam et al. | |
| 10,396,497 B1 | 8/2019 | Bame et al. | |
| 10,645,839 B2* | 5/2020 | Leung | H04Q 1/12 |
| 2009/0086456 A1 | 4/2009 | Milo et al. | |
| 2013/0107424 A1* | 5/2013 | Thomas | H05K 7/1411 |
| | | | 361/679.01 |
| 2020/0077537 A1 | 3/2020 | Leung et al. | |

OTHER PUBLICATIONS

Notice of Allowance received for U.S. Appl. No. 16/118,639 dated Jan. 30, 2020, 25 pages.

Wikipedia, "Pawl", URL: https://en.wikipedia.org/wiki/Pawl, Jan. 23, 2005, pp. 1-2.

Leung et al.; "Apparatus, System, and Method for Preventing Demate Between Field-Replaceable Units and Telecommunications Systems", U.S. Appl. No. 15/640,492, filed Jul. 1, 2017, 44 pages.

* cited by examiner

APPARATUS, SYSTEM, AND METHOD FOR PREVENTING DEMATE BETWEEN FIELD-REPLACEABLE UNITS AND TELECOMMUNICATIONS SYSTEMS

CROSS REFERENCE TO RELATED APPLICATION

This application is a continuation of U.S. application Ser. No. 16/118,639 filed 31 Aug. 2018, the disclosure of which is incorporated, in its entirety, by this reference.

BACKGROUND

Field-replaceable units (such as line cards) are often installed in telecommunications systems to facilitate communication among computing devices within a network. In this context, the term "field-replaceable unit" and its abbreviation "FRU" typically refer to modular devices that include one or more ports and/or interfaces that carry or forward traffic within a network and/or across multiple networks. For example, a router may include various Physical Interface Cards (PICs) and/or Flexible PIC Concentrators (FPCs) that facilitate communication among computing devices within a network and/or across multiple networks.

Unfortunately, FRUs often necessitate a certain degree of engineering tolerance to account for slightly different dimensions, properties, and/or specifications resulting from imperfections in the manufacturing process. As a result, some FRUs may fit differently than other FRUs within a telecommunications system. Such engineering tolerance and/or variance may lead some FRUs to demate and/or become disconnected from the backplane of the telecommunications system, potentially disrupting communications, impairing signal integrity, and/or impairing the performance and/or functionality of those FRUs and/or the telecommunications system.

The instant disclosure, therefore, identifies and addresses a need for improved and/or additional apparatuses, systems, and methods for preventing demate between FRUs and telecommunications systems.

SUMMARY

As will be described in greater detail below, the instant disclosure generally relates to apparatuses, systems, and methods for preventing demate between FRUs and telecommunications systems. In one example, an apparatus for accomplishing such a task may include (1) an FRU that (A) is designed to mate with a backplane of a telecommunications system and (B) facilitates communication among computing devices within a network and (2) at least one multi-bar ejector that (A) is coupled to the FRU, (B) fastens to a housing of the telecommunications system to enable the FRU to mate with the backplane of the telecommunications system, and (C) includes a spring coupled to at least one bar of the multi-bar ejector that, when the multi-bar ejector is fastened to the housing of the telecommunications system, applies a force on the FRU that pushes the FRU toward the backplane of the telecommunications system.

Similarly, a system incorporating the above-described apparatus may include (1) a communications circuit that facilitates communication among computing devices within a network, (2) at least one connector that facilitates communicatively coupling the communications circuit to a backplane of a telecommunications system, and (3) at least one multi-bar ejector that (A) fastens to a housing of the telecommunications system to enable the connector to communicatively couple the communications circuit to the backplane of the telecommunications system and (B) includes a spring coupled to at least one bar of the multi-bar ejector that, when the multi-bar ejector is fastened to the housing of the telecommunications system, applies a force on the FRU that pushes the connector toward the backplane of the telecommunications system.

A corresponding method may include (1) securing at least one spring to a multi-bar ejector that fastens to a housing of a telecommunications system and (2) coupling the multi-bar ejector to an FRU designed to mate with a backplane of the telecommunications system such that when the multi-bar ejector is fastened to the housing of the telecommunications system, the spring secured to the multi-bar ejector applies a force on the FRU that pushes the FRU toward the backplane of the telecommunications system.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
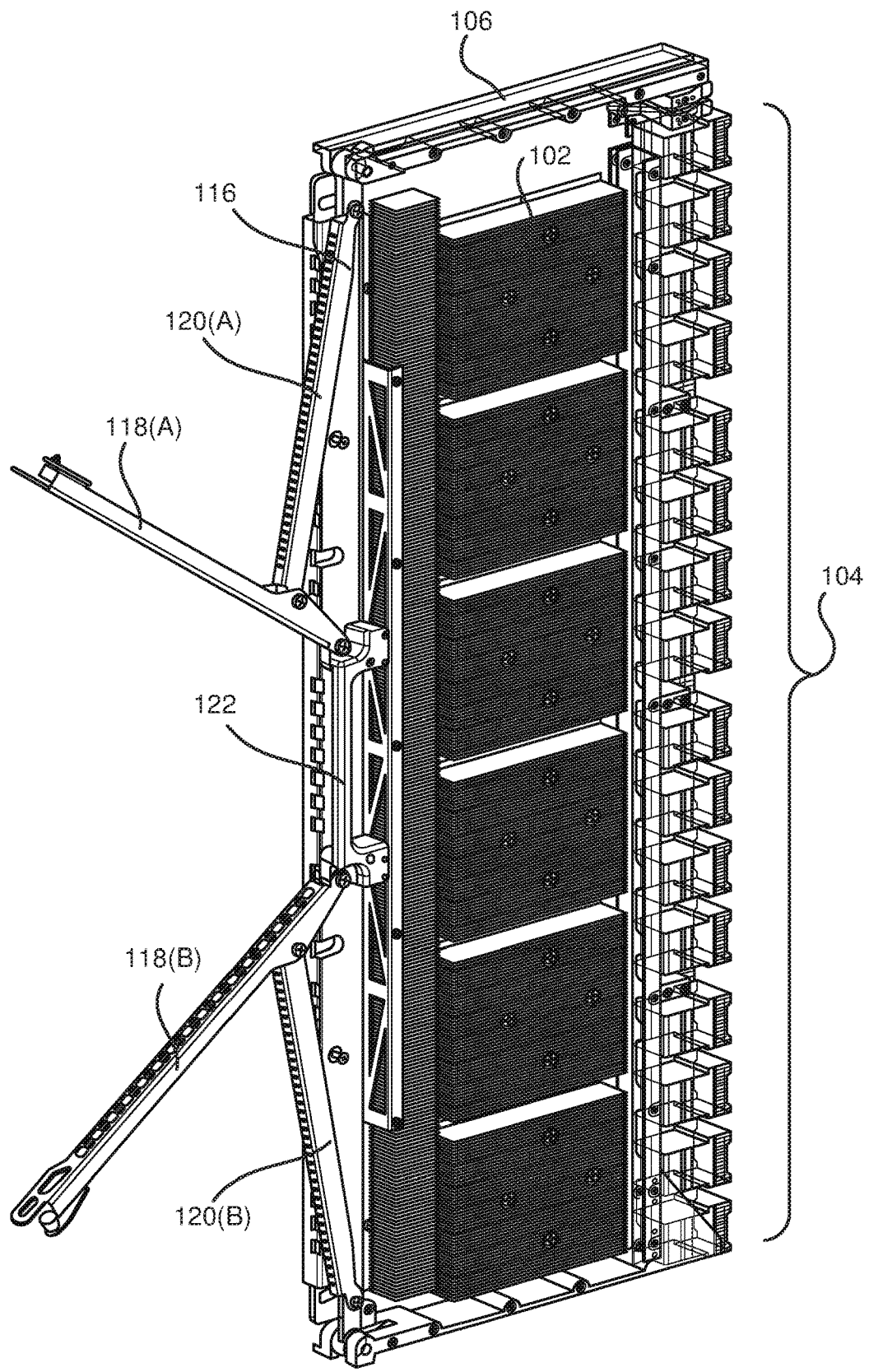
FIG. 1 is an illustration of an exemplary apparatus for preventing demate between FRUs and telecommunications systems.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for preventing demate between FRUs and telecommunications systems. As will be explained in greater detail below, embodiments of the instant disclosure may facilitate fastening an FRU to the housing of a telecommunications system by way of a multi-bar ejector. In some embodiments, this multi-bar ejector may include a spring that applies a force on the FRU. This force may push the FRU toward the backplane of the telecommunications system. By pushing the FRU toward the backplane in this way, the force may effectively prevent demate between the FRU and the backplane of the telecommunications system.

Furthermore, the spring within the disclosed multi-bar ejector may prevent the FRU from being driven into an overmated and/or overseated condition. For example, the spring may ensure that the FRU is fully mated with the backplane of the housing of the telecommunications system even when the housing exhibits minimal engineering tolerances, thereby eliminating the need to intentionally overseat the FRU (as is sometimes done by traditional systems for mating FRUs to telecommunications systems). In addition, this spring may absorb excess force that a technician may inadvertently apply to the mufti-bar ejector when inserting the FRU into a slot within the telecommunications system. Accordingly, embodiments of the instant disclosure may effectively safeguard, protect, and/or preserve both the signal integrity and physical components of FRUs, thereby improving the performance and/or functionality of FRUs and/or telecommunications systems.

The term "demate," as used herein, generally refers to any amount of gap and/or space that (1) exists between the connectors on an FRU and the backplane of a telecommunications system and (2) potentially impairs the signal integrity of communications exchanged between the FRU and the backplane of the telecommunications system. Similarly, the phrase "to demate" and/or "demating," as used herein, generally refers to the act of causing and/or experiencing demate.

The following will provide, with reference to FIGS. 1-6, examples of apparatuses, systems, and corresponding components that facilitate preventing demate between FRUs and telecommunications systems. In addition, an exemplary method for preventing demate between FRUs and telecommunications systems will be provided in connection with FIG. 7.

FIG. 1 shows an exemplary apparatus 100 for preventing demate between an FRU and a telecommunications system. In one example, apparatus 100 may include one or more FRUs, such an FRU 102. In some embodiments, FRU 102 may be designed to fit in a slot within a telecommunications system (not illustrated in FIG. 1). Specifically FRU 102 may mate with the backplane of the telecommunications system.

The term "field-replaceable unit" and its abbreviation "FRU," as used herein, generally refer to any type or form of modular device that includes one or more ports and/or interfaces that carry and/or forward traffic within a network and/or across multiple networks. Examples of FRU 102 include, without limitation, PICs, FPCs Switch Interface Boards (SIBs), control boards, routing engines, communication ports, fan trays, connector interface panels, routers, switches, portions of one or more of the same, combinations or variations of one or more of the same, and/or any other suitable FRU.

The term "backplane," as used herein, generally refers to any type or form of circuit board and/or signal aggregator that connects certain ports and/or interfaces from various FRUs installed in a telecommunications system. The term "telecommunications system," as used herein, generally refers to any type or form of network device that facilitates the exchange of communications among computing devices. Examples of such a telecommunications system include, without limitation, routers (such as provider edge outers, hub routers, spoke routers, autonomous system boundary routers, and/or area border routers), switches, hubs, modems, bridges, repeaters, gateways, multiplexers, network adapters, network interfaces, network racks, chasses, servers, portions of one or more of the same, combinations or variations of one or more of the same, and/or any other suitable telecommunications system.

As illustrated in FIG. 1, FRU 102 may include connectors 104. The term "connector," as used herein, generally refers to any type or form of full or partial fastener, fitting, receptacle, and/or coupling that facilitates a communicative connection and/or interface between an FRU and a telecommunications system. In one example, connectors 104 may include and/or represent physical contacts and/or terminals that facilitate the transfer of communications and/or network traffic. In this example, connectors 104 on FRU 102 may attach to and/or interface with corresponding connectors on the backplane of the telecommunications system. In this way, these connectors may establish communicative continuity between FRU 102 and the backplane of the telecommunications system.

In some examples, connectors 104 on FRU 102 may include and/or represent one side of a connection and/or interface. Additionally or alternatively, connectors 104 on FRU 102 may include and/or represent one side of connectors that correspond to and/or mate with another side of those connectors (not illustrated in FIG. 1) on the backplane of the telecommunications system.

In some examples, connectors 104 may include and/or represent electrical connectors that facilitate communication by way of electrical signals. In other examples, connectors 104 may include and/or represent optical connectors that facilitate communication by way of optical signals.

As illustrated in FIG. 1, apparatus 100 may include a housing 106. Housing 106 generally represents any type or form of structure, device, and/or support that secures and/or supports FRU 102. In some examples, housing 106 may contain one or more components that facilitate securing FRU 102 within the housing of the telecommunications system.

As illustrated in FIG. 1, apparatus 100 may also include one or more multi-bar ejectors, such as multi-bar ejector 116. The term "multi-bar ejector," as used herein, generally refers to any type or form of physical member, object, and/or device that facilitates securing and/or interfacing an FRU with the housing of a telecommunications system by transmitting and/or transferring force applied to one or more components of the multi-bar ejector to the housing.

In one example, multi-bar ejector 116 may contain one or more levers, such as levers 118(A) and 118(B). In this example, a technician may press levers 118(A) and/or 118(B) in order to fasten multi-bar ejector 116 to the housing of the telecommunications system. In some embodiments, pressing lever 118(A) and/or 118(B) may transmit force applied to the levers to additional bars within multi-bar ejector 116. Specifically, levers 118(A) and 118(B) may transmit force to a link 120(A) and a link 120(B), respectively. As will be explained in greater detail below, links 120(A) and 120(B) may include one or more springs. These springs may perform a variety of functions to protect and/or optimize the operation of FRU 102. For example, the springs may apply a sufficient amount of force on FRU 102 to cause FRU 102 to fully mate with the backplane of the telecommunications system. Additionally or alternatively, the springs may absorb excess force applied to levers 118(A) and 118(B).

As shown in FIG. 1, multi-bar ejector 116 may also include a connection 122. In some examples, connection 122 may couple levers 118(A) and 118(B) to each other and/or additional components of apparatus 100.

In the example of FIG. 1, the bars of multi-bar ejector 116 may create and/or represent two link-lever pairs. Specifically, multi-bar ejector 116 may include one link-lever pair composed of lever 118(A) and link 120(A) and another link-lever pair composed of lever 118(B) and link 120(B). In some embodiments, each link-lever pair may be operated independently. In general, multi-bar ejector 116 may contain any number and/or configuration of links, levers, connections, and/or link-lever pairs.

Figure 2:
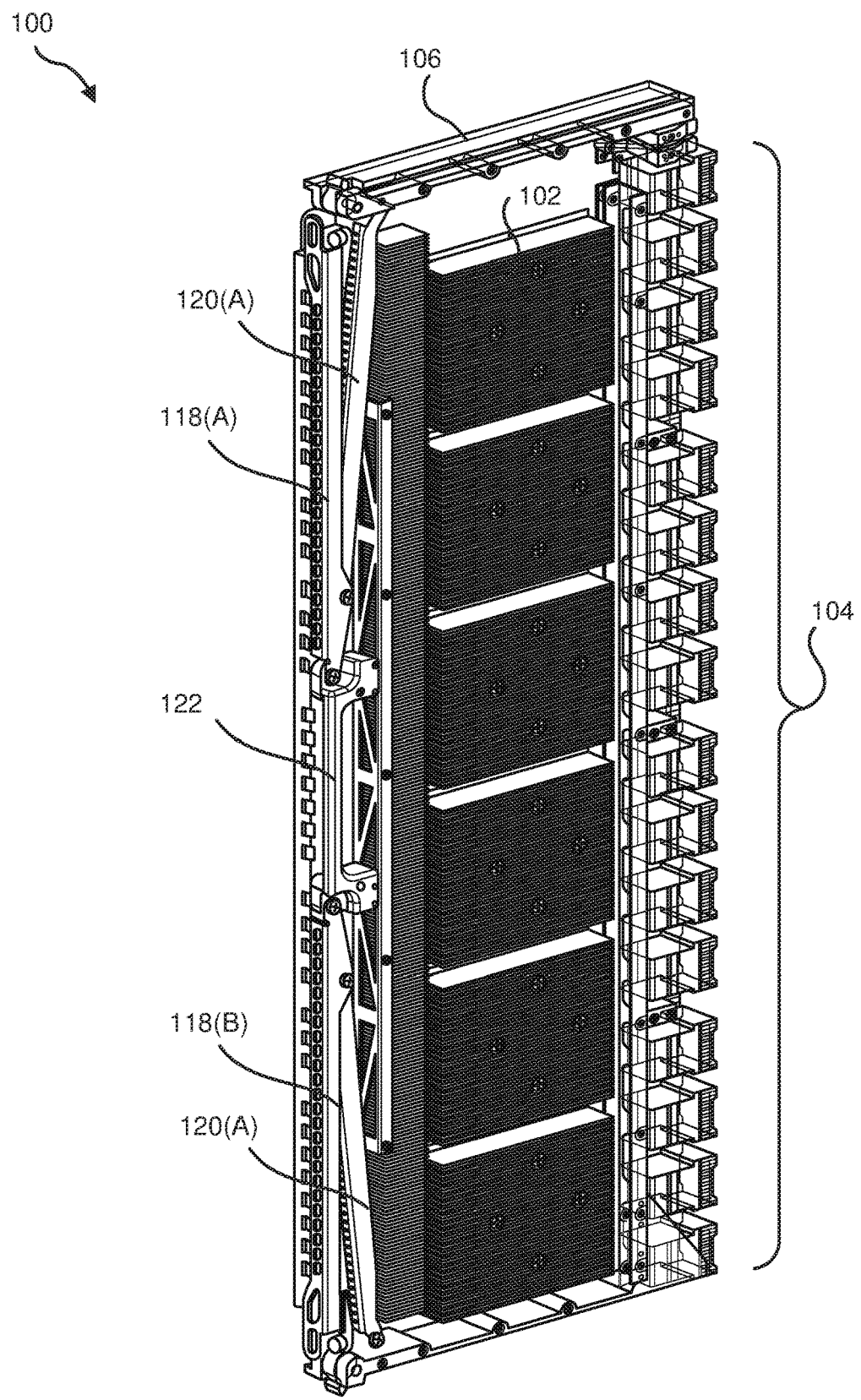
FIG. 2 is an additional illustration of an exemplary apparatus for preventing demate between FRUs and telecommunications systems.

FIG. 1 illustrates apparatus 100 when multi-bar ejector 116 is in an open position. Specifically, FIG. 1 illustrates the position and/or arrangement of bars within multi-bar ejector 116 before multi-bar ejector 116 is fastened to the housing of the telecommunications system. In contrast, FIG. 2 illustrates apparatus 100 when multi-bar ejector 116 is in a closed position. Specifically, FIG. 2 illustrates the position and/or arrangement of the bars within multi-bar ejector 116 after a technician has inserted apparatus 100 into the housing of the telecommunications system such that multi-bar ejector 116 is fastened to the housing.

Figure 3:
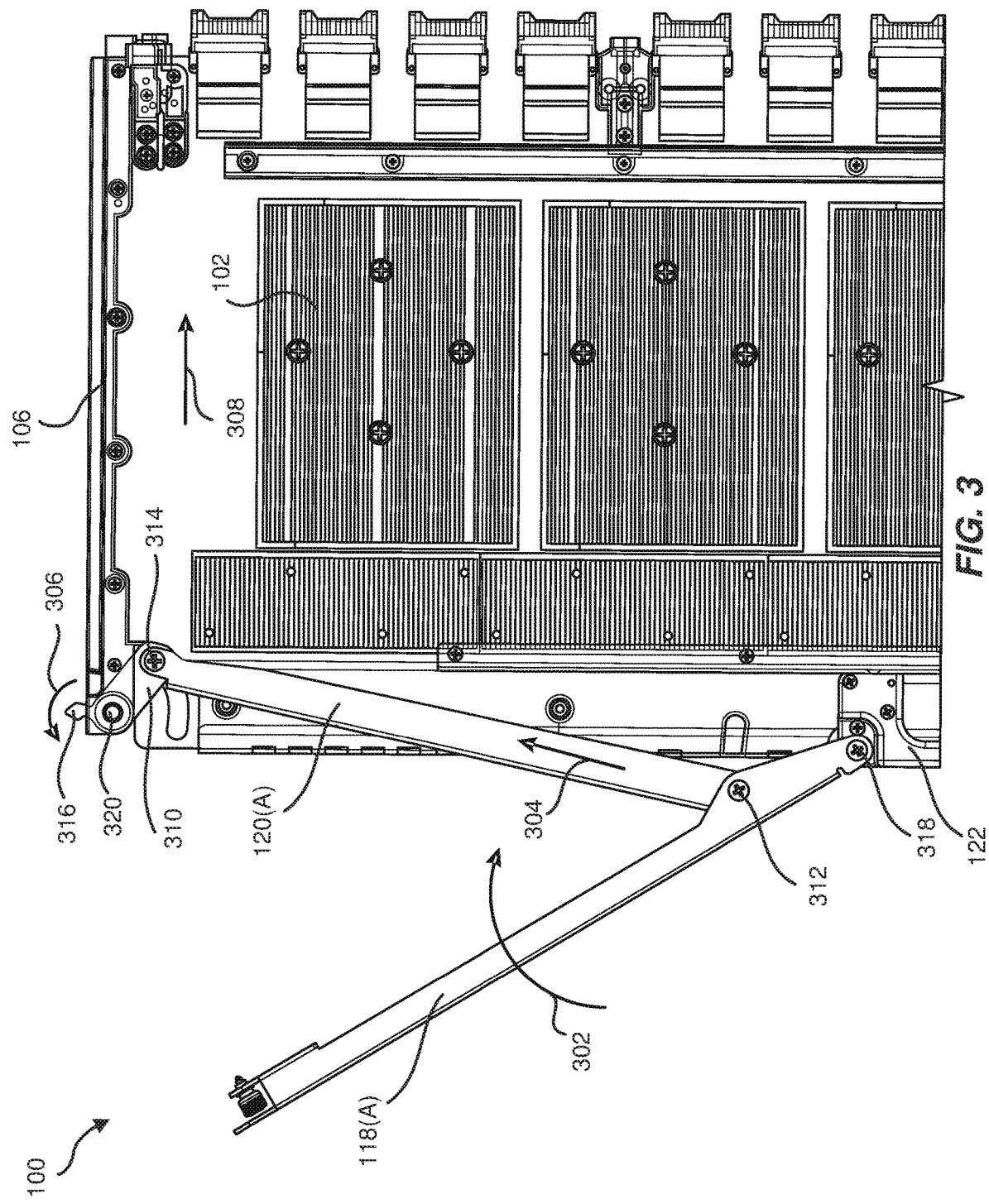
FIG. 3 is an additional illustration of an exemplary apparatus for preventing demate between FRUs and telecommunications systems.

FIG. 3 illustrates an exemplary view of a portion of apparatus 100. As shown in FIG. 3, apparatus 100 may include one or more joints, such as joints 312, 314, and 318. The term "joint," as used herein, generally refers to any type or form of hinge, connector, and/or fastener that enables a component to rotate, at the joint, in at least one direction. In one example, lever 118(A) may be attached to connection 122 via joint 318. In addition, one end of link 120(A) may be attached to lever 118(A) via joint 312. Furthermore, the other end of link 120(A) may be attached to a pawl 310 via joint 314.

The term "pawl", as used herein, generally refers to any type or form of device, structure, and/or mechanism that engages with a component of a device such that movement between the pawl and the component is prevented and/or reduced in at least one direction. In one embodiment pawl 310 may prevent and/or reduce movement between FRU 102 and the backplane of the telecommunications system via a latch 316. Latch 316 generally represents any protrusion and/or extension of pawl 310 that hooks, fastens, and/or otherwise engages with one or more components of the housing of the telecommunications system. In the example of FIG. 3, pawl 310 may be secured to housing 106 via a fastener 320. In this example, fastener 320 may enable pawl 310 to rotate around fastener 320. In some embodiments, apparatus 100 may include an additional pawl that is similarly coupled to link 120(B) and housing 106.

In order to move multi-bar ejector 116 from an open position to a closed position, a technician may apply force to lever 118(A). This force may produce rotation of lever 118(A) at joint 318 (corresponding to a movement 302 shown by an arrow in FIG. 3). In one example, movement 302 may in turn produce movement of link 120(A) (corresponding to a movement 304).

In some examples, movement 304 of link 120(A) may in turn produce movement of pawl 310. For example, the force applied to link 120(A) from lever 118(A) may cause a torque to be applied to pawl 310. This torque may cause pawl 310 to rotate around fastener 320 (corresponding to a movement 306). In one embodiment, movement 306 of pawl 310 may cause latch 316 to engage with one or more components of the housing of the telecommunications system.

In some examples, movement 304 of link 120(A) may also cause FRU 102 to move toward the backplane of a telecommunications system. For example, movement 304 may cause link 120(A) to press against FRU 102, thereby producing a movement 308 of FRU 102. Additionally or alternatively, movement 308 of FRU 102 may be generated by and/or as a result of latch 316 engaging with the housing of the telecommunications system. In some embodiments, engaging latch 316 with the housing of the telecommunications system may fasten multi-bar ejector 116 to the housing of the telecommunications system.

Figure 4:
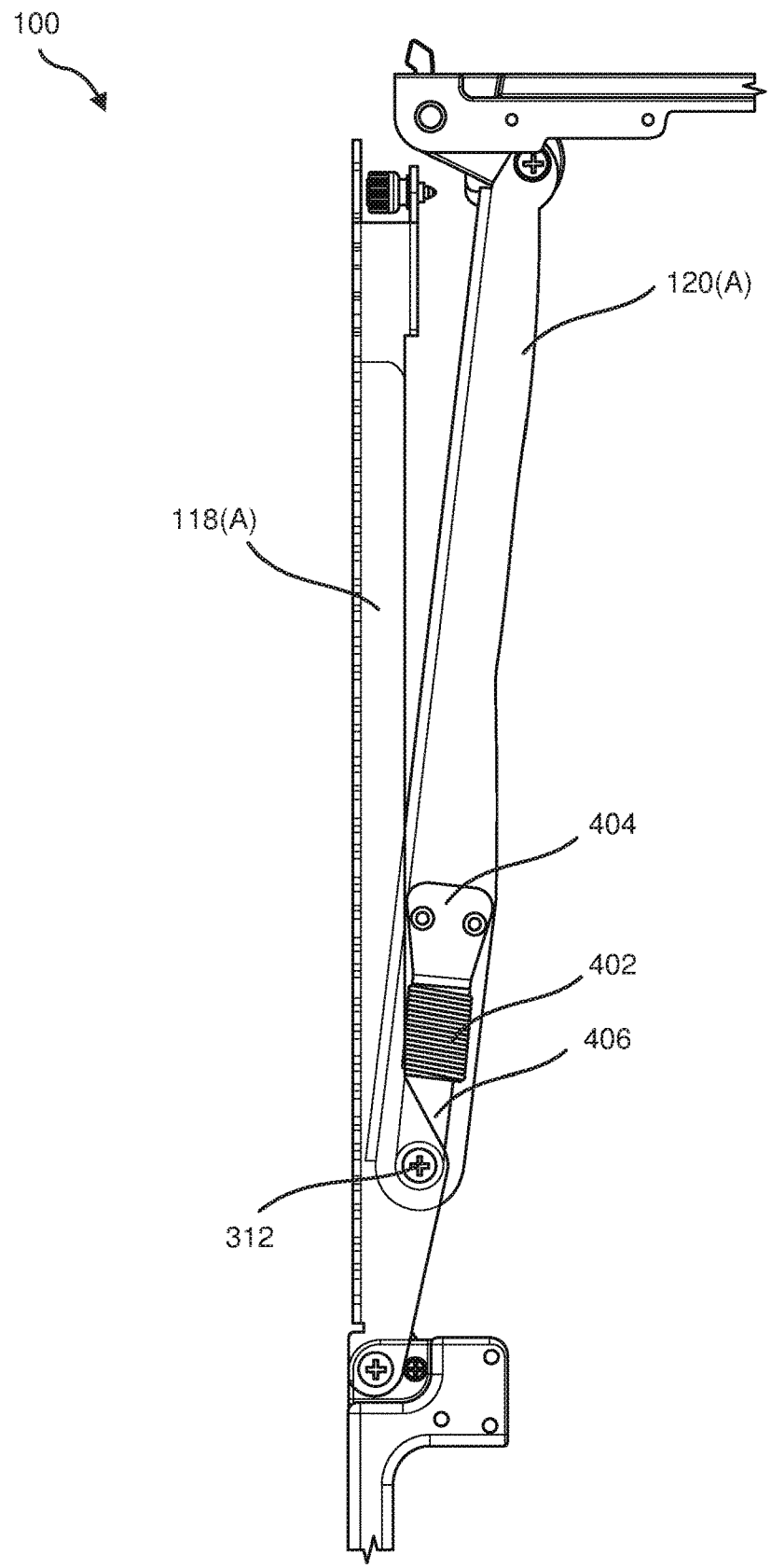
FIG. 4 is an additional illustration of an exemplary apparatus for preventing demate between FRUs and telecommunications systems.

FIG. 4 illustrates an additional exemplary view of a portion of apparatus 100. As shown in FIG. 4, link 120(A) may include and/or be coupled to a spring 402. The term "spring," as used herein, generally refers to any type or form of device, object, and/or mechanism that stores and/or discharges mechanical energy and/or force. In some examples, spring 402 may include and/or represent a set of Belleville disc springs. In one example, this set of Belleville disc springs may be formed by conical washers stacked in series. In another example, this set of Belleville disc springs may be formed by conical washers, some of which are stacked in series and some of which are stacked in parallel. Additional examples of spring 402 include, without limitation, tension springs, extension springs, leaf springs, horseshoe springs, torsion springs, compression springs, coil springs, constant-force springs, gas springs, combinations or variations of one or more of the same, and/or any other suitable spring.

In some examples, spring 402 may be preloaded such that, when multi-bar ejector 116 is fastened to the housing of the telecommunications system, spring 402 applies a force on FRU 102. This force may push FRU 102 toward the backplane of the telecommunications system. For example, when multi-bar ejector 116 is closed, the pre-loaded force within spring 402 may apply a torque to pawl 310. Due to this torque, latch 316 of pawl 310 may engage with one or more components of the housing of the telecommunications system. In some embodiments, the force from spring 402 may cause pawl 310 to become spring-loaded (e.g., pawl 310 may transmit force from spring 402 to the housing of the telecommunications system). This force from pawl 310 may push FRU 102 toward the backplane of the telecommunications system. In particular, this force may prevent FRU 102 from demating from the backplane of the telecommunications system.

Accordingly, spring 402 may maintain and/or keep FRU 102 in a fully mated position with respect to the backplane of the telecommunications system. In other words, spring 402 may engage FRU 102 such that FRU 102 and the backplane of the telecommunications system do not experience any degree of demate that interferes with and/or impairs the signal integrity of communications exchanged between FRU 102 and the backplane of the telecommunications system.

Spring 402 may be coupled to link 120(A) in a variety of ways. In the example of FIG. 4, spring 402 may be secured within link 120(A) by a bracket 404 and a rod-end 406. As will be explained in greater detail below, bracket 404 and/or rod-end 406 may facilitate compression and/or decompression of spring 402. In some examples, a change in the length of spring 402 may produce a corresponding change in the length of link 120(A). In one embodiment, an additional spring may be similarly secured within link 120(B). In general, links 120(A) and 120(B) may contain any number, combination, and/or configuration of springs.

Figure 5:
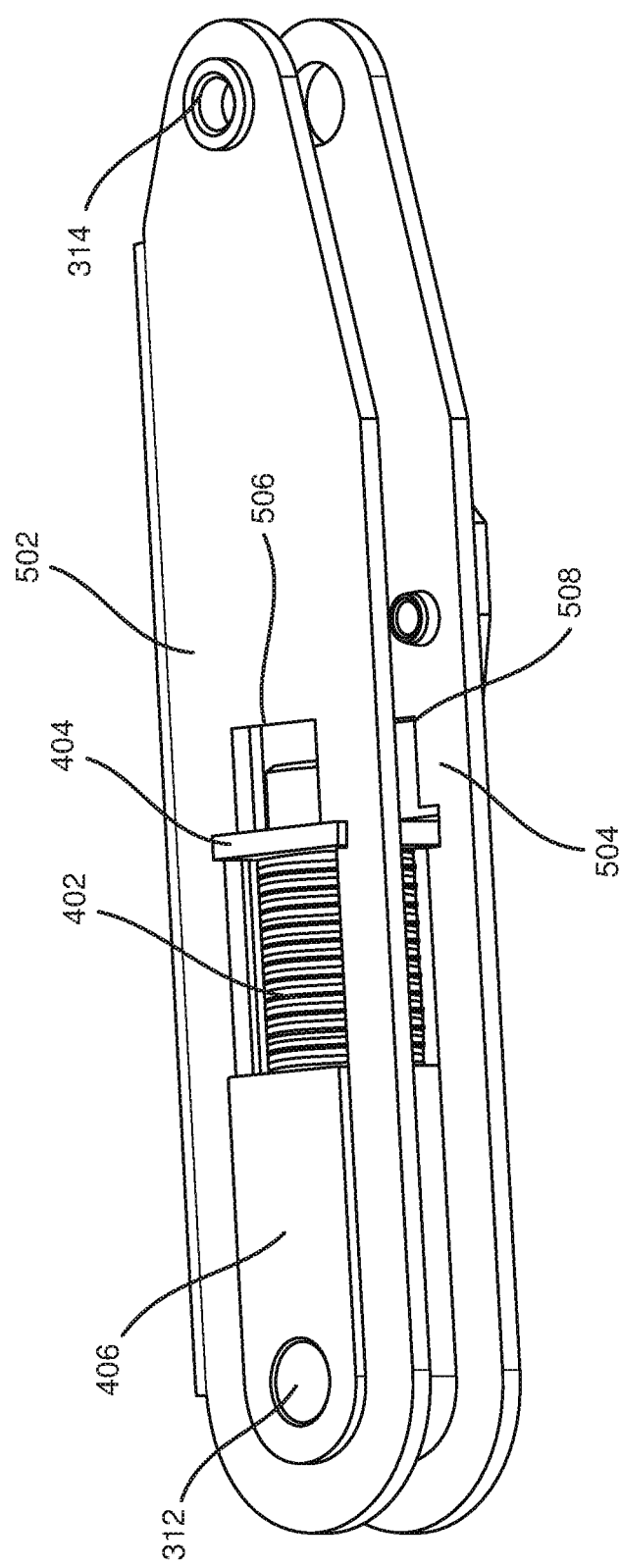
FIG. 5 is an illustration of an exemplary component within an apparatus for preventing demate between FRUs and telecommunications systems.

FIG. 5 illustrates an exemplary configuration of spring 402 within link 120(A). In this example, link 120(A) may include and/or be composed of a plate 502 and a plate 504. In one embodiment, spring 402 may be secured between plates 502 and 504. For example, the coils (e.g., washers) of spring 402 may encircle and/or be wrapped around a rod (not visible in FIG. 5). One end of this rod may be coupled to bracket 404 and the other end of the rod may be coupled to rod-end 406. Bracket 404 and/or rod-end 406 may then be secured within an opening 506 of plate 502 and an opening 508 of plate 504.

In one embodiment, bracket 404 may prevent and/or limit the movement of spring 402. For example, bracket 404 may be rigidly fastened to plates 502 and 504 such that the end of spring 402 in contact with bracket 404 may not move and/or shift with respect to plates 502 and 504.

In some examples, rod-end 406 may represent and/or include a hollow tube into which the rod supporting spring 402 may be inserted. In addition, the outer sides of rod-end 406 may each include a lip and/or extension that rests on the outer sides of plates 502 and/or 504. These lips and/or extensions may secure rod-end 406 to plates 502 and 504. As shown in FIG. 5, rod-end 406 may also include and/or encompass joint 312.

In one embodiment, rod-end 406 may facilitate movement of spring 402. For example, rod-end 406 may be capable of sliding within openings 506 and 508. In the example of FIG. 5, rod-end 406 may be capable of sliding from the position shown in FIG. 5 toward bracket 404 (i.e., to the right). As rod-end 406 moves toward bracket 404, spring 402 may compress. In addition, because rod-end 406 encompasses joint 312, movement of rod-end 406 may decrease the distance between joint 312 and joint 314. In some embodiments, this movement may effectively decrease the length of link 120(A).

Figure 6:
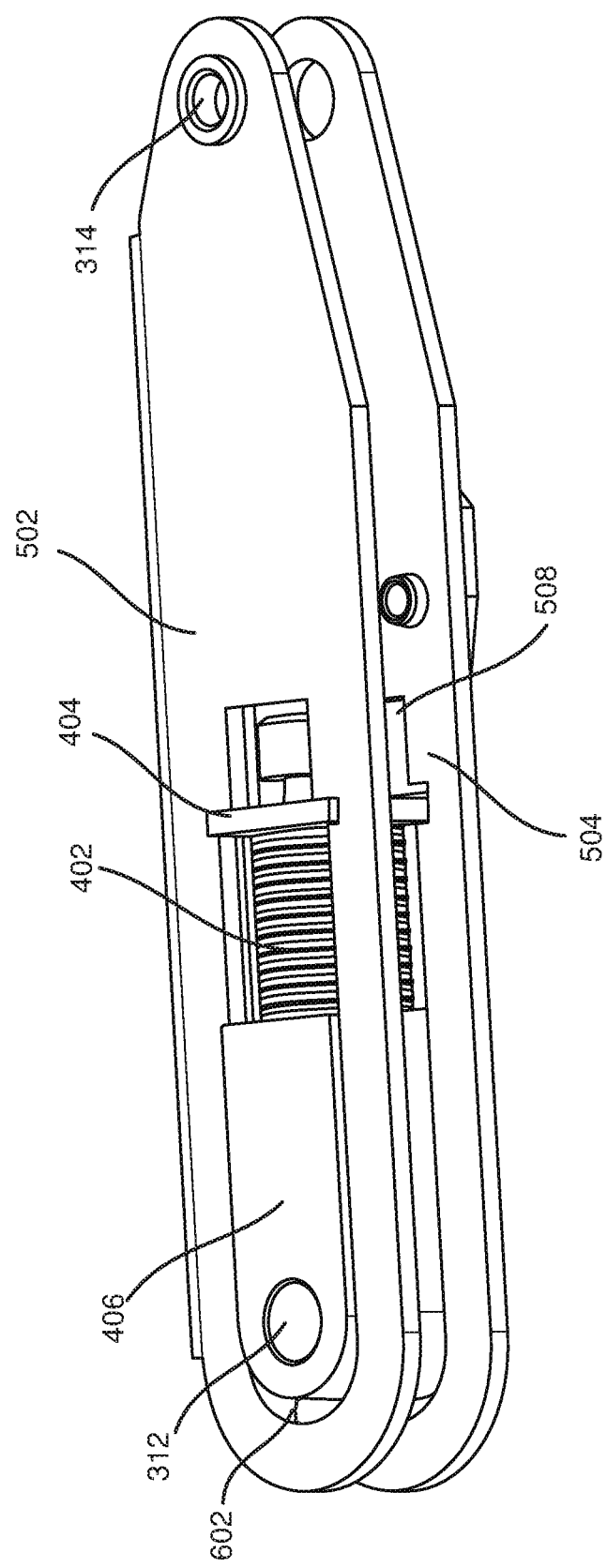
FIG. 6 is an additional illustration of an exemplary component within an apparatus for preventing demate between FRUs and telecommunications systems.

FIG. 6 illustrates an additional exemplary configuration of spring 402 within link 120(A). Specifically, FIG. 6 illustrates the positions of spring 402 and rod-end 406 after rod-end 406 has moved a distance 602 within openings 506 and 508. In one embodiment, distance 602 may correspond to the maximum distance rod-end 406 is capable of moving.

In some examples, enabling spring 402 to compress within link 120(A) may prevent FRU 102 from being driven into an overmated position and/or condition. For example, spring 402 may compress appropriately and/or as necessary to absorb any and/or all excess force inadvertently applied to multi-bar ejector 116 by a technician when closing multi-bar ejector 116. In addition, spring 402 may compress and/or decompress to account for various engineering tolerances of FRU 102 and/or the housing of the telecommunications system, thereby ensuring that FRU 102 is fully mated (but not overmated) with the backplane of the telecommunications system.

Figure 7:
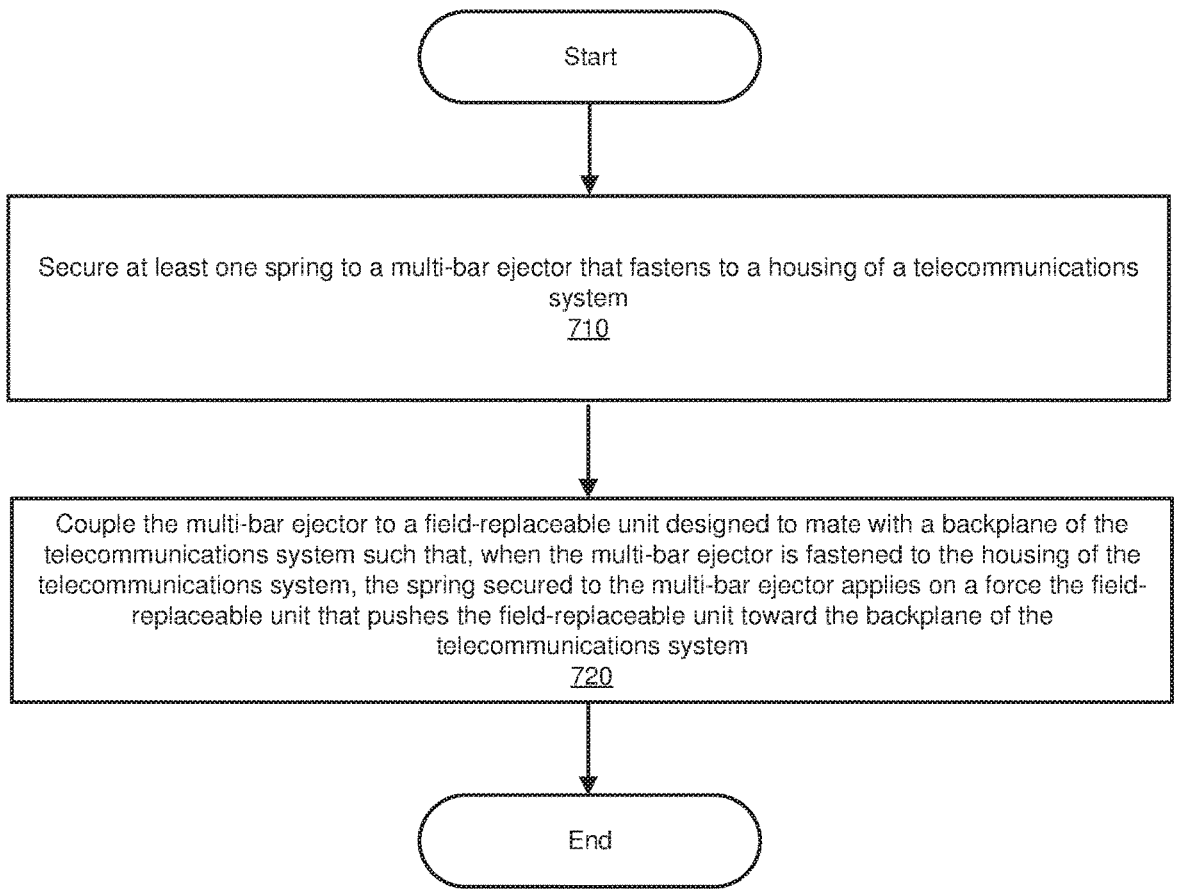
FIG. 7 is a flow diagram of an exemplary method for preventing demate between FRUs and telecommunications systems.

FIG. 7 is a flow diagram of an exemplary method 700 for preventing demate between FRUs and telecommunications systems. As illustrated in FIG. 7, method 700 may include the step of securing at least one spring to a multi-bar ejector that fastens to a housing of a telecommunications system (710). This securing step may be performed in a variety of ways and/or contexts. For example, a telecommunications equipment manufacturer and/or subcontractor may assemble multi-bar ejector 116.

In one example, the telecommunications equipment manufacturer and/or subcontractor may assemble multi-bar ejector 116 by manufacturing two link-lever pairs that each contain an instance of spring 402. In this example the telecommunications equipment manufacturer and/or subcontractor may secure each instance of spring 402 between instances of bracket 404 and rod-end 406. The telecommunications equipment manufacturer may then attach each link-lever pair to connection 122.

Returning to FIG. 7, method 700 may include the step of coupling the multi-bar ejector to an FRU designed to mate with a backplane of the telecommunications system such that when the multi-bar ejector is fastened to the housing of the telecommunications system, the spring secured to the multi-bar ejector applies a force on the field-replaceable unit that pushes the field-replaceable unit toward the backplane of the telecommunications system (720). This coupling step may be performed in a variety of ways and/or contexts. For example, a telecommunications equipment manufacturer and/or subcontractor may manually secure, couple, and/or fix multi-bar ejector 116 to FRU 102. Specifically, the telecommunications equipment manufacturer and/or subcontractor may secure multi-bar ejector 116 to housing 106 that contains FRU 102.

Once multi-bar ejector 116 is coupled to FRU 102, a technician may install FRU 102 into a telecommunications system by inserting FRU 102 into a corresponding slot and then fastening multi-bar ejector 116 to the housing of the telecommunications system. When multi-bar ejector 116 is fastened to the housing, spring 402 may apply a force on FRU 102. This force may push FRU 102 toward the backplane of the telecommunications system. By pushing FRU 102 toward the backplane in this way, the force may effectively prevent demate between FRU 102 and the backplane of the telecommunications system. Accordingly, multi-bar ejector 116 may effectively safeguard, protect, and/or preserve communications and/or signal integrity, thereby improving the performance and/or functionality of FRU 102 and/or the telecommunications systems.

As explained above in connection with FIGS. 1-7, demate between FRUs and backplanes may occur due to engineering tolerances. While such demate may not cause much of a problem at low signal speeds, even small amounts of demate may significantly impair signal integrity at high signal speeds. To address the issue of demate, a telecommunications equipment manufacturer may intentionally overdrive the connector interface between an FRU and the backplane of a telecommunications system, thereby creating an interference condition to eliminate the risk of demate and/or undermate. Unfortunately, this overdriving of the connector interface may damage the FRU and/or backplane in one way or another.

To reduce the risk of damage, the telecommunications equipment manufacturer may add a spring to multi-bar ejectors used to fasten the FRU to the housing of the telecommunications system, thereby effectively creating a spring-loaded FRU. In doing so, the telecommunications equipment manufacturer may incorporate compliance into the ejector system to limit the amount of residual reaction force, thereby mitigating the likelihood of damage to the FRU and/or the backplane. Instead of dealing with an uncontrolled scenario driven by tolerances, this compliant ejector system may apply a force that pushes the FRU toward the backplane of the telecommunications system. However, rather than driving the FRU into an overmated condition and/or position, this compliant ejector system may serve and/or act as a buffer that absorbs any residual reaction force and/or any engineering tolerances to place the FRU into a fully mated condition and/or position. Moreover, the compliant ejector system may absorb excessive force that a technician may inadvertently apply to the ejector system when inserting the FRU into the telecommunications system.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a field-replaceable unit that:
        is designed to mate with a backplane of a telecommunications system; and
        facilitates communication among computing devices within a network;
    at least one multi-bar ejector that:
        is coupled to the field-replaceable unit;
        fastens to a housing of the telecommunications system to enable the field-replaceable unit to mate with the backplane of the telecommunications system;
        includes a first lever that is coupled at one end to a bar attached to the field-replaceable unit;
        includes a second lever that is coupled at one end to the bar attached to the field-replaceable unit;
        includes a first link that is coupled between the field-replaceable unit and the first lever via a first joint;
        includes a second link that is coupled between the field-replaceable unit and the second lever via a second joint;
        includes a first set of Belleville disc springs that are stacked in series, wherein the first set of Belleville disc springs is coupled within the first link of the multi-bar ejector such that, when the multi-bar ejector is fastened to the housing of the telecommunications system, the first set of Belleville disc springs applies a first force on the field-replaceable unit that pushes the field-replaceable unit toward the backplane of the telecommunications system; and
        includes a second set of Belleville disc springs that are stacked in series, wherein the second set of Belleville disc springs is coupled within the second link of the multi-bar ejector such that, when the multi-bar ejector is fastened to the housing of the telecommunications system, the second set of Belleville disc springs applies a second force on the field-replaceable unit that pushes the field-replaceable unit toward the backplane of the telecommunications system.

2. The apparatus of claim 1, wherein the first and second forces applied by the first and second sets of Belleville disc springs cause the field-replaceable unit to fully mate with the backplane of the telecommunications system.

3. The apparatus of claim 1, wherein the first and second forces applied by the first and second sets of Belleville disc springs maintain the field-replaceable unit in a fully mated position with respect to the backplane of the telecommunications system such that, when the multi-bar ejector is fastened to the housing, the field-replaceable unit does not demate from the backplane of the telecommunications system.

4. The apparatus of claim 1, wherein:
    the first link is capable of rotating, at the first joint, in at least one direction with respect to the first lever; and
    the second link is capable of rotating, at the second joint, in at least one direction with respect to the second lever.

5. The apparatus of claim 4, wherein the first set of Belleville disc springs is coupled within the first link such that applying force to the first lever transmits force to the first set of Belleville disc springs.

6. The apparatus of claim 5, wherein the multi-bar ejector further comprises a pawl that, when engaged with the housing of the telecommunications system, facilitates fastening the field-replaceable unit to the housing of the telecommunications system.

7. The apparatus of claim 6, wherein:
    an opposite end of the first link is coupled to the pawl via an additional joint attached to the opposite end of the first link; and
    when force is applied to the first lever, the force transmitted to the first set of Belleville disc springs applies a torque to the pawl such that the pawl engages with the housing of the telecommunications system.

8. The apparatus of claim 1, wherein:
    the field-replaceable unit includes a first side of at least one connector;
    the backplane of the telecommunications system includes a second side of the connector; and
    the multi-bar ejector, when fastened to the housing, causes the first side of the connector included on the field-replaceable unit to mate with the second side of the connector included on the backplane of the telecommunications system.

9. The apparatus of claim 8, wherein the first force applied by the first set of Belleville disc springs causes the field-replaceable unit to fully mate with the backplane of the telecommunications system such that no air gap exists between the first side of the connector included on the field-replaceable unit and the second side of the connector included on the backplane of the telecommunications system.

10. The apparatus of claim 8, wherein the first force applied by the first set of Belleville disc springs causes the field-replaceable unit to fully mate with the backplane of the telecommunications system such that any air gap that exists between the first side of the connector included on the field-replaceable unit and the second side of the connector included on the backplane of the telecommunications system has a negligible effect on the integrity of signals exchanged between the field-replaceable unit and the backplane of the telecommunications system via the connector.

11. The apparatus of claim 1, wherein the first set of Belleville disc springs is preloaded such that the first force that pushes the field-replaceable unit toward the backplane of the telecommunications system is sufficient to drive the field-replaceable unit into a fully mated position.

12. A field-replaceable unit comprising:
a communications circuit that facilitates communication among computing devices within a network;
at least one connector that facilitates communicatively coupling the communications circuit to a backplane of a telecommunications system; and
at least one multi-bar ejector that:
fastens to a housing of the telecommunications system to enable the connector to communicatively couple the communications circuit to the backplane of the telecommunications system;
includes a first lever that is coupled at one end to a bar attached to the field-replaceable unit;
includes a second lever that is coupled at one end to the bar attached to the field-replaceable unit;
includes a first link that is coupled between the field-replaceable unit and the first lever via a first joint;
includes a second link that is coupled between the field-replaceable unit and the second lever via a second joint;
includes a first set of Belleville disc springs stacked in series within the first link such that, when the multi-bar ejector is fastened to the housing of the telecommunications system, the first set of Belleville disc springs applies a first force on the field-replaceable unit that pushes the connector toward the backplane of the telecommunications system; and
includes a second set of Belleville disc springs stacked in series within the second link such that, when the multi-bar ejector is fastened to the housing of the telecommunications system, the second set of Belleville disc springs applies a second force on the field-replaceable unit that pushes the connector toward the backplane of the telecommunications system.

13. The field-replaceable unit of claim 12, wherein the first and second forces applied by the first and second sets of Belleville disc springs cause the field-replaceable unit to fully mate with the backplane of the telecommunications system.

14. The field-replaceable unit of claim 12, wherein the first and second forces applied by the first and second sets of Belleville disc springs maintain the field-replaceable unit in a fully mated position with respect to the backplane of the telecommunications system such that, when the multi-bar ejector is fastened to the housing, the field-replaceable unit does not demate from the backplane of the telecommunications system.

15. The field-replaceable unit of claim 12, wherein:
the first link is capable of rotating, at the first joint, in at least one direction with respect to the first lever; and
the second link is capable of rotating, at the second joint, in at least one direction with respect to the second lever.

16. The field-replaceable unit of claim 15, wherein the first set of Belleville disc springs is coupled within the first link such that applying force to the first lever transmits force to the first set of Belleville disc springs.

17. The field-replaceable unit of claim 12, further comprising a pawl that, when engaged with the housing of the telecommunications system, facilitates fastening the field-replaceable unit to the housing of the telecommunications system.

18. A method comprising:
securing a first set of Belleville disc springs stacked in series to a first link of a multi-bar ejector that fastens to a housing of a telecommunications system, the first link being coupled between a field-replaceable unit designed to mate with a backplane of the telecommunications system and a first lever via a first joint;
coupling one end of the first lever to a bar attached to the field-replaceable unit;
securing a second set of Belleville disc springs stacked in series to a second link the multi-bar ejector that fastens to the housing of the telecommunications system, the second link being coupled between the field-replaceable unit and a second lever via a second joint;
coupling one end of the second lever to the bar attached to the field-replaceable unit; and
coupling the multi-bar ejector to the field-replaceable unit such that, when the multi-bar ejector is fastened to the housing of the telecommunications system, the first and second sets of Belleville disc springs secured to the multi-bar ejector apply one or more forces on the field-replaceable unit that pushes the field-replaceable unit toward the backplane of the telecommunications system.

* * * * *